United States Patent de Leeuw et al.

[11] 4,250,209
[45] Feb. 10, 1981

[54] TRANSFER METALLIZING PROCESS AND PRODUCT PRODUCED THEREBY

[75] Inventors: Johannes A. N. de Leeuw, Apeldoorn; Johannes T. Brugmans, Enkhuizen, both of Netherlands

[73] Assignee: Lurex B.V., Netherlands

[21] Appl. No.: 904,700

[22] Filed: May 10, 1978

[51] Int. Cl.³ .................. C23C 13/02; C23C 13/04; B05D 5/10
[52] U.S. Cl. ............................. 427/250; 156/231; 156/233; 427/251; 427/265; 427/270; 427/288; 428/202; 428/209; 428/211; 428/339; 428/464
[58] Field of Search ............... 428/219, 202, 209, 211, 428/339, 464; 427/250, 251, 288, 265, 270; 156/233, 231

[56] References Cited

U.S. PATENT DOCUMENTS

| | | | |
|---|---|---|---|
| 1,096,822 | 5/1914 | Brandt | 156/233 |
| 3,043,728 | 7/1962 | Stauffer | 156/233 X |
| 3,589,962 | 6/1971 | Bonjour | 156/233 |
| 3,690,909 | 9/1972 | Finley | 156/233 X |
| 3,730,752 | 5/1973 | Garza et al. | 427/265 X |
| 3,753,850 | 8/1973 | Brunet | 156/233 X |
| 4,112,190 | 9/1978 | Sato et al. | 427/250 X |

FOREIGN PATENT DOCUMENTS 2555087 6/1976 Fed. Rep. of Germany.

Primary Examiner—Thomas J. Herbert, Jr.
Attorney, Agent, or Firm—Fleit & Jacobson

[57] ABSTRACT

A major surface of a polymeric film such as untreated polypropylene is coated with a release agent which has the capacity to effect a weak, releasable bond with the surface of the polymeric film and a stron, non-releasable bond with the surface of metal, e.g., aluminum, which has been freshly vapor deposited; precipitating a thin, coherent stratum of the desired metal upon the coated surface of the polymeric film by vapor deposition; whereupon are applied simultaneously (1) a layer of a standard laminating adhesive to the stratum of the metal, which is then bonded thereby to the non-metallic substrate by standard laminating techniques; a composite structure having the following configuration is produced as a result: polymeric film/release agent coating/vapor deposited metal stratum/laminating adhesive layer/non-metallic substrate and (2) a coating of the release agent to the free major surface of the polymeric film; from which composite structure the polymeric film is then stripped.

12 Claims, 3 Drawing Figures

TRANSFER METALLIZING PROCESS AND PRODUCT PRODUCED THEREBY

BACKGROUND OF THE INVENTION

1. Field of the Invention

The present invention relates generally to the production of a laminar stock material, one layer of which is a metal. In particular, the invention relates to a transfer process for the application of a thin, coherent metallic stratum, such as aluminum, to a major surface of a non-metallic substrate, such as paper, and to the product produced thereby.

2. Prior Art Statement

Over the years considerable effort has been expended in the development of stock material in the form of laminar webs, in order to achieve enhanced functional properties in addition to improved appearance. For example, laminates comprising a metallic layer have found widespread utility in the preparation of packages, overwraps, and the like, because of their lustrous appearance as well as the excellent moisture vapor and gas vapor barriers which they present. Of particular inportance in this field are the laminates comprising a thin metal layer and a fibrous layer, e.g., one fabricated from fibrous pulp, esp. paper. In this regard, the pertinent prior art against which the present invention stands out as an advantageous and non-obvious improvement is set forth as follows:

1. U.S. Pat. No. 3,730,752 discloses that a rough or porous material, such as uncoated paper, may be metallized by first being given a smooth surface by the application of a film of any of a number of plastic resinous priming materials. After solidification of this prime coat, a very thin layer of vaporized metal is deposited thereon. See esp. col. 2, lines 18-35.

By this process curl free products are very difficult to obtain. That is to say, the paper shrinks on the side from which water has been evaporated, resulting in a product with a high curl tendency. Moreover, the reflectivity of the products obtained leaves much to be desired. Coating of the rough surface of the paper is expected to provide a mirrorlike surface upon which the very thin layer of vaporized metal may be deposited. However, with thick precoatings on ordinary paper or thinner precoatings of very expensive, smoother papers, it is not possible to achieve a reflectivity of better than 50-70%, which is not satisfactory in today's market. Finally, the coatings employed cannot be brittle so as to cause a break upon folding of the final product. However, flexible plastic coatings change the dead fold properties of the final product, thereby introducing problems in the employment of most packaging machines in use today.

2. U.S. Pat. No. 3,043,728 discloses an apparatus and process for the vapor deposition of an aluminum layer upon a non-metallic substrate such as paper. A drum having a smooth, shiny surface is provided, upon which surface a release agent is deposited. The drum surface contining the release agent is then caused to rotate into a sealed, high-vacuum coating chamber, wherein this surface is exposed to aluminum vapor, which condenses thereon as a shiny film. Thereupon this surface moves out of the high-vacuum chamber and into contact with the adhesive surface carried by a paper substrate. The adhesive is firmly united to the thin aluminum film, after which the paper, with the aluminum film bonded thereto, is stripped from the drum, which then passes into a cleaning station prior to the application of another coating of release agent. See esp. col 2, lines 7-51. In the employment of this apparatus and process, residual release agent, specks of aluminum and/or adhesive are removed by brushing and grinding of the drum. Unfortunately, such treatment adversely affects the reflectivity of the final product, as it has a pernicious effect upon the smoothness of the replica surface of the drum. Moreover, synchronization of the individual steps of this in-line process is very difficult to achieve and maintain, as a result of which a considerable amount of waste product is produced. Finally, in order to prevent damage to the essential layers of the final laminar product (viz., the release coating layer and the aluminum stratum), such layers cannot make any contact with the seals of the high-vacuum chamber. This results in intolerable leakages from the chamber and extreme difficulty in the obtainment of acceptable vacuum levels therein.

3. West German Offenlegungsschrift No. 2555087 discloses a process for producing a shiny metallic coating upon a sheet or film such as paper. According to this process, the substrate sheet or film is coated on one surface thereof with a thin layer of a glaze, which upon subsequent removal of the vehicle therefrom is hardened or crosslinked after a certain time. Also supplied is a plastic film, upon one surface of which a metallization means is provided, wherein dispersed metal powder is integrated. The substrate and the plastic film are then brought together (as by rolling) so that the matallization means is absorbed by the glaze. The plastic film acts as an intermediate carrier during the drying, hardening, or polymerization of the glaze, whereupon the film is separated from the substrate, producing a substrate having a shiny metallic coating thereon. In the practice of such a process, it is necessary to have a high concentration of metal powder in the metallization medium, in order that the resulting metallic surface be sufficiently reflective. Unfortunately, such a high concentration of metal also results in a metallic surface having a readilly visible variation in lay. That is to say, an objectionable pattern may be easily seen in the surface. Furthermore, such as esthetically undesirable pattern is indicative of surface discontinuities (instead of the desired uninterrupted continuum), which do in fact result in inferior barrier properties. Furthermore, by this process it is very difficult, if not impossible, to prepare a final product having a metallic layer with a thickness of much less than 1 micron. This is indeed unfortunate, as the cost of useful metals such as aluminum continues to rise with the cost of the energy required for their production. To be expedient, this process would have to employ less than 10 percent of the aluminum or other metal currently required therein.

SUMMARY OF THE PRESENT INVENTION

It is accordingly a primary object of the present invention to provide a process for the application of a thin, coherent metallic stratum to a major surface of a non-metallic substrate, such as paper, which process obviates the disadvantages of the prior art as typified by the processes referred to above. It is also a primary object of the present invention to provide a novel composite laminar structure comprising a metallic layer, e.g., of aluminum, and a film or fibrous sheet, e.g., one fabricated from fibrous pulp, esp. paper, which structure possesses a combination of properties heretofore unobtainable. These objects are achieved by the provision of a process which comprises the combination of the following procedural steps:

(a) coating a major surface of a polymeric film with a release agent which has the capacity to effect a weak, releasable bond with the surface of the polymeric film and a strong, non-releasable bond with the surface of a stratum of metal which has been freshly vapor deposited;

(b) precipitating a thin, coherent stratum of metal upon the coated surface of the polymeric film by vapor deposition;

(c) applying a layer of a standard laminating adhesive to the exposed surface of the stratum of vapor deposited metal and bonding said stratum of metal to a non-metallic substrate by standard laminating techniques, whereby the following composite structure is prepared: polymeric film/release agent coating/vapor deposited metal stratum/laminating adhesive layer/non-metallic substrate; and (d) stripping the polymeric film from said composite structure.

This process is especially advantageously employed when the metal is aluminum and the non-metallic substrate is a film or fibrous sheet, e.g., one fabricated from a fibrous pulp, esp. paper. Moreover, it has been found highly desirable to use polypropylene as a polymeric film—esp. polypropylene the surface of which has not been subjected to any pre-treatment—and a vinyl chloride-vinyl acetate copolymer or a vinylidene chloride copolymer as the release agent. Very beneficial results are achieved when such copolymer is the primary component of an admixture comprising one or more of the following standard additives: coloring agents, matting agents, printing agents, slipping agents, and ultraviolet light absorbing agents. An even greater efficiency and economy of operation are achieved, moreover, when the metallized substrate is slit to the desired width simultaneously with the removal of the polymeric film from the composite structure. Outstanding efficiency and economy of operation are achieved when the deposited metal stratum is aluminum having a thickness between about 0.01 and 0.1 microns. Furthermore, standard laminating techniques are employed with especially good results in the bonding of the stratum of metal to the non-metallic substrate. When paper is the non-metallic substrate, wet laminating techniques are advantageously employed. To be sure, the stratum of metal may be deposited as a continuous film, or it may be deposited in the configuration of bands, stripes, or lines, which may be spaced or interconnected, in order to prepare partly metallized products which may be required for decorative or technical reasons.

An especially advantageous modification of the basic process is a procedure wherein simultaneously with the application of the laminating adhesive to the exposed surface of the vapor deposited stratum of metal, a coating of the release agent is applied to the free major surface of the polymeric film, thereby rendering this surface ready for the start of a subsequent metallizing procedure after the polymeric film has been stripped from the composite.

Another especially advantageous modification of the basic process is a procedure wherein both major surfaces of the polymeric film are simultaneously coated with the release agent; a thin, coherent stratum of metal is then simultaneously vapor deposited upon each coated surface of the polymeric film; each vapor deposited stratum of metal is then bonded to a separate non-metallic substrate by standard laminating techniques, whereby a bifacial composite structure is produced; whereupon the polymeric film is removed therefrom to produce two metallized non-metallic substrates.

When the process of the present invention is used to produce a metallized paper composite, and when the outer layer of this composite comprises a vinyl chloride-vinyl acetate copolymer applied in an amount between about 1 and 1.5 grams per square meter, upon which a coherent, continuous stratum of aluminum having a thickness of between about 0.01 and 0.1 microns has been vapor deposited, and when a standard wet laminating adhesive is employed to bond the metal stratum to the paper substrate, a product is produced having a combination of properties heretofore unobtainable, viz: a reflectivity of at least 85 percent, a heat emission of about 8 percent of the constant of Stefan-Boltzmann at 23° C., a water vapor permeability of 8 grams/square meter/day at 25° C. and 75% relative humidity, and dead fold properties substantially the same as those of the paper substrate per se.

When the process of the present invention is used to produce a metallized paper composite, and when the outer layer of this composite comprises a vinylidene chloride copolymer (e.g., Saran) applied in an amount between about 3.5 and 4.5 grams per square meter, upon which a continuous stratum of aluminum having a thickness between about 0.04 and 0.1 microns has been vapor deposited, and when a standard wet laminating adhesive is employed to bond the metal stratum to the paper substrate, a product is produced having a combination of properties heretofore unobtainable, viz: a reflectivity of at least 85 percent, a heat emission of about 8 percent of the constant of Stefan-Boltzmann at 23° C., a water vapor permeability of 2 grams/square meter/day at 25° C. and 75% relative humidity, an oxygen permeability of 4 cc/square meter/day at 1 ATM and 25° C. and 0% relative humidity and dead fold properties substantially the same as those of the paper substrate per se. For both products set forth above, perfect printability is achieved using all existing printing methods, such as gravure printing on acetate—toluene-and alcohol-basis, and flexo printing.

BRIEF DESCRIPTION OF THE DRAWING

For a more complete understanding of the present invention, including its primary objects and beneficial results, reference should be made to the Detailed Description of the Preferred Embodiments, which is set forth below. This Detailed Description should be read together with the accompanying drawing, wherein FIG. 1, FIG. 2, and FIG. 3 schematically depict essential phases of the process of the present invention, and FIG. 3 also schematically represents products of the present invention.

DETAILED DESCRIPTION OF THE PREFERRED EMBODIMENTS

Figure 1:
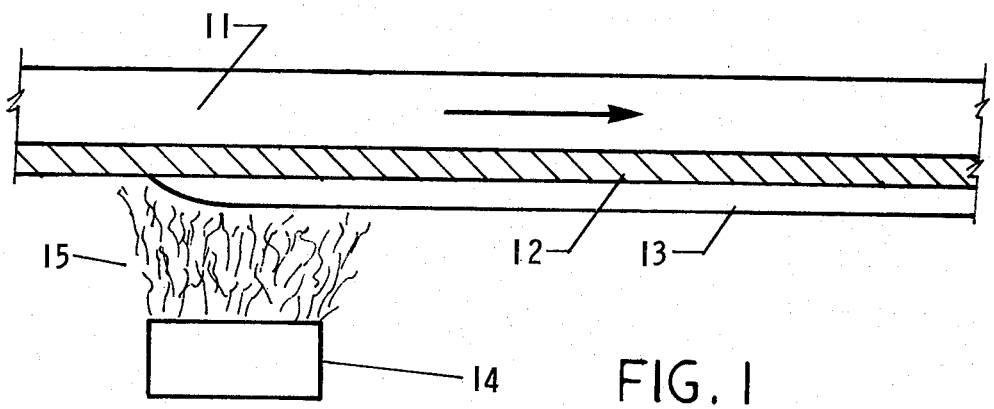
Figure 3:
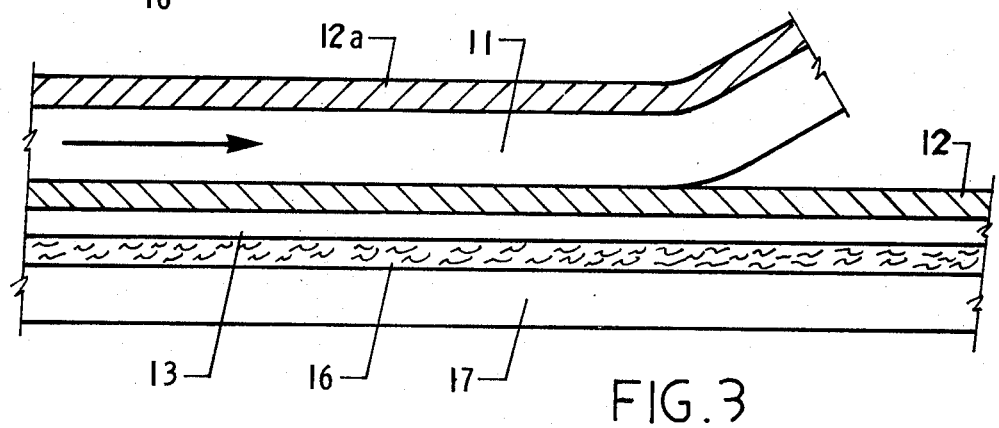

With particular reference to the drawing, there is schematically shown in FIG. 1 a first essential phase of the process according to the present invention. A commercially available polymeric film (11)—e.g., polypropylene having a thickness of 15–20 microns, neither surface of which has been subjected to any pre-treatment—is provided with a coating of a release agent (12). Any composition which has the capacity to effect a weak, releasable bond with the surface of the polymeric film and a strong, non-releasable bond with the surface of a metal which has been freshly vapor deposited will suffice as the release agent. Advantageously employed is a film forming vinyl chloride-vinyl acetate copolymer, esp. one having the following composition: 86 percent vinyl chloride, 13 percent vinyl acetate, and 1 percent maleic acid. Such is available, for example, under the designation Bakelite Vinyl Solution Resin VMCH. Also advantageously employed is a film-forming vinylidene chloride copolymer, esp. vinylidene chloride-vinyl chloride copolymers which are available, for example, under the designation of Saran F 310 and Saran XD 8400. Release agent coating (12) is conveniently applied to polymeric film (11) by any of a number of standard methods, well-known in the art. Accordingly, the release agent composition may be utilized as a melt, solution, paste, or lacquer. It may be applied by spreading with a knife, brushing, using a roller, calendering, casting, or like methods. An applied amount of from 1 to 5 grams per square meter has been found especially desirable and convenient. Although the release agent may comprise a single copolymeric composition such as the vinyl chloride-vinyl acetate or vinylidene copolymer referred to above, it may also comprise a mixture of a number of such components. Moreover, it may comprise in addition one or more secondary additives selected from the group consisting of standard coloring agents, standard matting agents, standard printing agents, standard slipping agents, and standard ultraviolet light absorbing agents. The desirability of such an admixture is appreciated by those of skill in the art when it is understood that release agent coating (12) will eventually become the outermost layer of the final laminar product produced, as is seen in FIG. 3. Accordingly, novel and beneficial color, matting, slipping, and absorbing properties are afforded, depending upon the nature of the secondary additive(s) employed.

In addition to the polypropylene referred to above, the polymeric film (11) may be any of a number of standard films readily available commercially, such as other polyolefins (e.g., polyethylene); polyamides (e.g, nylon); polyesters (e.g., polyethylene terephthalate); acrylics, (e.g., polyacrylonitrile); and the like. For films other than untreated polyolefins, the used release agent should be selected on its capacity to effect a weak, releasable bond with its surface, and a strong, non releasable bond with the surface of the used deposited metal. Untreated polyolefins will have a free surface tension of less than about 35 dynes/cm and preferably less than about 30 dynes/cm. The thickness of polymeric film (11) is not critical; however it is advantageous if a film having a thickness of between about 10 and 30 microns is employed. It is particularly noteworthy that under the broad range of conditions specified above, polymeric film (11) may be used over and over again in the subject process, without the necessity for replacement or cleaning thereof, and without any adverse effect upon any of the steps of this process. This presents an outstanding and unobvious advantage.

Polymeric film (11) to which release agent coating (12) has been applied, is then caused to travel in the direction shown by the arrow in FIG. 1, in order that a coherent metallic stratum (13) may be precipitated upon coating (12) by standard vapor deposition techniques. For example, as schematically depicted in FIG. 1, metallic vapors (15) emanating from a molten metal in crucible (14) in a high vacuum chamber (not shown), form a metallic stratum (13) upon the release agent coating (12) as polymeric film (11) is caused to remain in the chamber or to travel therein. Vacuums of $10^{-3}$ torr and less are commonly employed in such high vacuum chambers. As is understood by those of skill in this art, the metallic vapor may be generated by the depicted thermal evaporation technique, if desired. As is understood from FIG. 1, direct heat applied to a metal contained in crucible (14)—which is commonly constructed from boron nitride—will cause metallic vapors (15) to be generated and to impinge and be deposited upon the exposed surface of release coating (12). Metals having utility in the instant process are aluminum, gold, silver, magnesium, zinc, titanium, and nickel, among many others. For purposes of economy of operation, frugality in the utilization of energy, and outstanding product properties, the thickness of the metallic stratum (13) should be between about 0.01 and 0.1 microns. Aluminum is preferred as the metal to be employed because of its relativity low cost and the outstanding properties of the very thin strata deposited therefrom.

Ordinarily the metallic stratum will be deposited in a continuous, coherent film or integral layer coextensive with the surface of the release agent coating upon the polymeric film. However, it has been found advantageous to deposit the metal in one or more bands, stripes, or lines for certain applications—e.g., for decorative purposes, wherein a particular partly metallized ornamental design is effected; or technical reasons, e.g., in order to prepare products for electronic components. Depending upon the specific purpose, the bands, stripes, or lines may be isolated from each other or connected in a chosen pattern. Such a deposition in the configuration of a band, stripe, or line may be accomplished by means of standard mashing techniques, as are well known and commonly employed in the art.

Figure 2:
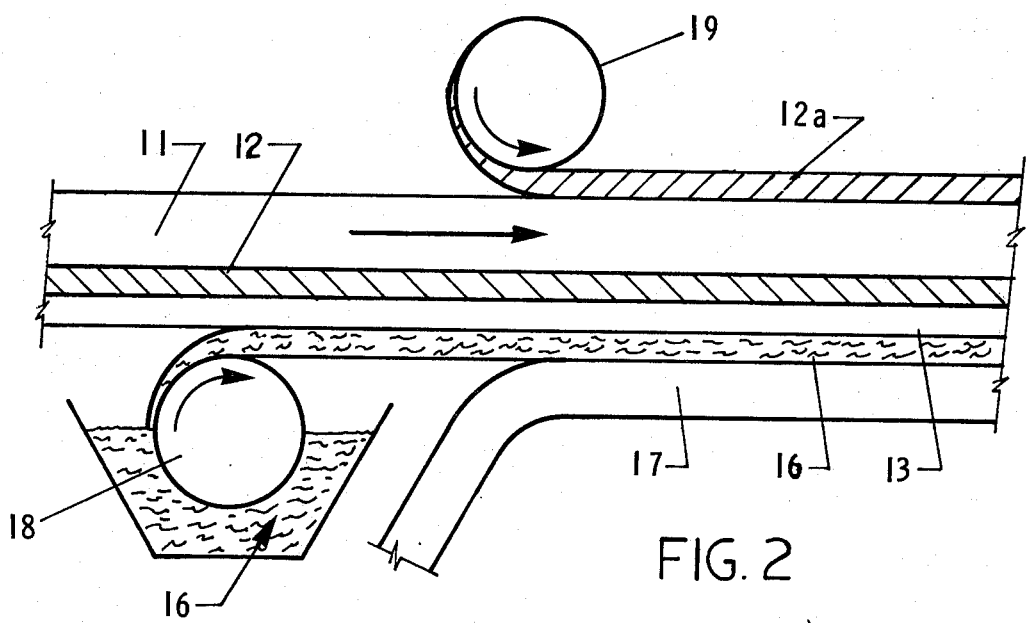

With particular reference to FIG. 2, there is shown a second essential phase of the process according to the present invention. After being removed from the high vacuum metallizing chamber (not shown), polymeric film (11), having release agent coating (12) and metallic stratum (13) applied thereto, is caused to travel in the direction shown by the arrow, whereupon it is contacted with a standard laminating adhesive (16). Following this contact, non-metallic substrate (17) is applied to laminating adhesive (16) and thereby bonded to metallic stratum (13) by means of standard laminating techniques (as by the employment of appropriate pressure and/or temperature, and/or time, etc., as is well understood by those of skill in the art). The following composite structure is produced as a result: polymeric film (11)/release agent coating (12)/vapor deposited metal stratum (13)/laminating adhesive layer (16)/non-metallic substrate (17). As is seen in the figure, special advantages may be achieved, if, simultaneoulsy with the application of laminating adhesive (16) to the exposed surface of the vapor deposited metal stratum (13), a second coating (12a) of the release agent is applied—as by means of roller (19)—to the free major surface of polymeric film (11). Thereby such surface will be ready for the start of a subsequent metallizing procedure according to this invention, after the instant process is completed by the technique shown in FIG. 3. Referring again to FIG. 2, it is seen that the laminating adhesive (16) may be applied to metal stratum (13) by standard means, as by a roller (18) partially submerged in a vessel containing the adhesive (16). Of course, other means such as spreading with a knife, brushing, coating, spraying, etc., may be employed. The thickness of the layer of laminating adhesive (16) is not critical, and will vary with the nature of the adhesive employed. To be sure, the thickness must be sufficient to afford a bond of the stratum of metal (13) to the non-metallic substrate (17). When the latter is a film or sheet fabricated from a fibrous pulp (e.g, cardboard or esp. paper), a standard wet laminating adhesive is advantageously employed and standard wet laminating techniques are conveniently utilized. As an example, a cold soluble swelling potato starch denominated KELLOSAC 514 J has been employed with success, as have other vegetable and animal glues, as well as synthetics such as carboxylated butadiene-styrene. Of course, standard dry laminating techniques can be used, if desired. Under such conditions, a particularly useful adhesive has been found to be the alcohol-dilutable two component adhesive denominated ADCOTE 340, which is available commercially.

As the non-metallic substrate (17), the following have been employed with especially beneficial results: (a) films or sheets of a fibrous material fabricated from a fibrous pulp, such as cardboard, paperboard, and paper; (b) films or sheets of a fibrous material such as non-woven fabrics, spun-bonded fabrics, and the like. (Equally beneficial results are achieved with bonded fiber fleeces and the traditional woven and knitted textile fabrics having a "closed" surface, as is understood by those of skill in the art); (c) films or sheets of commonly employed plastic materials such as polyesters, polyamides, polyvinyl chloride, and cellophane.

A third essential phase of the basic process according to the present invention is depicted in FIG. 3, wherein it is seen that upon completion of the procedural steps necessary to form the composite structure of layers (11)/(12)/(13)/(16)/(17) (and (12a), if desired), polymeric film (11) (including layer (12a), if desired) is stripped or simply pulled mechanically from the composite structure to produce the desired laminar product. That such is so efficiently and conveniently accomplished without criticality is not at all obvious in view of the prior art. Moreover, as has already been pointed out, polymeric film (11) may be used over and over virtually indefinitely, without cleaning thereof or any adverse effect upon any procedural step, esp. without any adverse effect upon the quality of the metallic stratum (13). Such is also not at all obvious in view of the prior art. Furthermore, that the present process produces such outstanding products (as described in detail hereinbelow), which are indeed superior to those of the prior art, is also not at all obvious in view thereof.

In addition, the present process comprehends a number of modifications thereto, which are not illustrated per se in the drawings, but which are readily understood by a reference to the drawing figures discussed in detail hereinabove. Such modifications include, but are not limited to, the following:

(a) slitting the final laminar product to the desired or required width simultaneously with the removal of polymeric film (11) from the composite structure (11) (including 12a)/(12)/(13)/(16)/(17). Processing and economic advantages are thereby achieved.

(b) simultaneously coating both major surfaces of polymeric film (11) with release agent (12); simultaneously vapor depositing a coherent stratum of metal (13) upon each coated surface (12) of the polymeric film; simultaneously bonding each vapor deposited stratum of metal (13) to a separate non-metallic substrate (17) by means of a standard adhesive (16), using standard laminating techniques, to produce a bifacial composite structure having the following configuration of layers: (17)/(16)/(13)/(12)/(11)/(12)/(13)/(16)/(17); and stripping each face of the composite structure (viz., the components (12)/(13)/(16)/(17)) from polymeric film (11) to produce two metallized non-metallic substrates.

The following are examples of the outstanding products produced by the process set forth in detail hereinabove. It should be observed by those of skill in the art that these products have a combination of desirable properties heretofore unobtainable.

A. A number of composite laminar structures were prepared comprising a coherent, continuous outer layer of vinyl chloride-vinyl acetate copolymer, esp. a copolymer comprising vinyl chloride, vinyl acetate, and maleic acid, as previously set forth in detail above. This copolymer layer was evenly applied in an amount between about 1 and 1.5 grams per square meter. A coherent, continuous stratum of aluminum metal was then vapor deposited by standard methods upon this copolymer layer, the thickness of the aluminum stratum being between 0.01 and 0.1 microns. A layer of a laminating adhesive (e.g., a vegetable glue, esp. cold soluble swelling potato starch) was employed to bond the vapor deposited aluminum stratum to a standard paper substrate. All of the structures prepared under the broad range of conditions set forth above had the following characteristics:

1. A reflectivity of at least 85%. (This should be compared with reflectivities of less than 70%, which are characteristic of commercial products produced by "direct" metallizing processes). Reflectivity was measured on a photoelectric gloss measuring instrument manufactured by Dr. B. Lange, Berlin, Type M 1400, actual readings being compared with a mirror surface as 100%. The surfaces of the products of this invention, moreover, were observed to be extremely regular and free of patterns, etc. (This should be compared with the irregular, patterned surfaces of commercial products produced from powdered metal transfer processes.)
2. A heat emission of about 8 percent of the Stefan-Boltzmann constant at 23° C.
3. A water vapor permeability of 8 grams/square meter/day at 25° C. and 75% relative humidity, and 28 grams/square meter/day at 38° C. and 90% relative humidity (employing ASTM Test Method E 96). (This should be compared with a water vapor permeability of 25/grams/square meter/day at 25° C. and 75% relative humidity, and 190 grams/square meter/day at 38° C. and 90% relative humidity, which is characteristic of commercial products powdered from provided metal transfer processes.)
4. Dead fold properties which are the same as those of the paper substrate per se. (This is not afforded by prior art products.)

B. A number of composite laminar structures were prepared comprising a coherent, continuous outer layer of a vinylidene chloride copolymer, esp. one comprising vinylidene chloride and vinyl chloride and denominated Saran, as previously set forth in detail above. This copolymer layer was evenly applied in an amount between about 3.5 and 4.5 grams per square meter. A coherent, continuous stratum of aluminum metal was then vapor deposited by standard methods upon this copolymer layer, the thickness of the aluminum stratum being between 0.04 and 0.1 microns. A layer of a laminating adhesive (e.g., a vegetable glue, esp. cold soluble swelling potato starch) was employed to bond the vapor deposited aluminum stratum to a standard paper substrate. All of the structures prepared under the broad range of conditions set forth above had the following characteristics:

1. a reflectivity of at least 85%.
2. a heat emission of about 8 percent of the Stefan-Boltzmann constant at 23° C.
3. a water vapor permeability of 2 grams/square meter/day at 25° C. and 75% relative humidity, and 8 grams/square meter/day at 38° C. and 90% relative humidity.
4. Dead fold properties which are the same as those of the paper substrate per se.
5. An oxygen permeability (ASTM Test Method D 1434) of 4 CC per square meter per day at 1 ATM pressure, 25° C., and 0% relative humidity. (This should be compared with an oxygen permeability of 40 thousand CC per square meter per day at 1 ATM pressure, 25° C., and 0% relative humidity, which is characteristic of commercial products produced from powdered metal transfer processes.)

For all products produced by the process according to the present invention, printability properties were perfect, employing all known printing methods, including gravure printing on acetate—toluene—and alcohol—basis, and flexo printing.

Although the present invention has been described in detail with respect to certain preferred embodiments, variations and modifications in this detail are possible without departing from the spirit and scope of the present invention, which is defined in the hereto-appended claims.

What is claimed is:

1. In the process for the application of a thin, coherent metallic stratum to a major surface of a non-metallic substrate, the improvement therein which comprises:
   (a) coating a major surface of a polypropylene film, the surface of which has not been subjected to any pretreatment with a release agent having the capacity to effect a weak, releasable bond with the surface of the polypropylene film and a strong, non-releasable bond with the surface of a stratum of metal which has been freshly vapor deposited;
   (b) precipitating a thin, coherent stratum of metal upon the coated surface of the polypropylene film by vapor deposition;
   (c) applying simultaneously (1) a layer of a standard laminating adhesive to the exposed stratum of metal and bonding said stratum of metal to a non-metallic substrate by standard laminating techniques, whereby the following composite structure is prepared: polypropylene film/release agent coating/vapor deposited metal stratum/laminating adhesive layer/non-metallic substrate, and (2) a coating of the release agent to the free major surface of the polypropylene film; and
   (d) stripping the polypropylene film from said composite structure.

2. The process of claim 1, wherein the release agent is a vinyl chloride-vinyl acetate copolymer.

3. The process of claim 1, wherein the release agent is a vinylidene chloride copolymer.

4. The process of claim 2 or 3, wherein the release agent comprises a film forming copolymer as the primary component of an admixture containing an additive selected from the group consisting of coloring agents, matting agents, printing agents, slipping agents, and ultraviolet light absorbing agents.

5. The process of claim 1, which comprises the additional procedural step of slitting the metallized substrate to the desired width simultaneously with the removal of the polypropylene film from the composite structure.

6. The process of claim 1, wherein the stratum of metal is deposited in the configuration of a band, stripe, or line.

7. The process of claim 1, wherein the metal is aluminum.

8. The process of claim 7, wherein the thickness of the aluminum metal stratum is between 0.01 and 0.1 microns.

9. The process of claim 1, wherein the non-metallic substrate is a film or sheet of a fibrous material.

10. The process of claim 9, wherein the non-metallic substrate is a film or sheet fabricated from a fibrous pulp.

11. The process of claim 10, wherein the non-metallic substrate is paper.

12. The process of claim 10, wherein the laminating adhesive is a standard wet laminating adhesive and the standard laminating techniques are standard wet laminating techniques.

* * * * *